(12) United States Patent
Lin et al.

(10) Patent No.: US 10,649,025 B2
(45) Date of Patent: May 12, 2020

(54) EXTERNAL DQS BI-DIRECTIONAL LOOPBACK WITH USE OF FEED FORWARD EQUALIZATION PATH

(71) Applicant: CAVIUM, LLC, San Jose, CA (US)

(72) Inventors: David Da-Wei Lin, Westrborough, MA (US); Edward Wade Thoenes, Carlisle, MA (US)

(73) Assignee: Cavium, LLC., San Jose, CA (US)

( * ) Notice: Subject to any disclaimer, the term of this patent is extended or adjusted under 35 U.S.C. 154(b) by 26 days.

(21) Appl. No.: 15/934,804

(22) Filed: Mar. 23, 2018

(65) Prior Publication Data
US 2019/0293709 A1  Sep. 26, 2019

(51) Int. Cl.
*G01R 31/28* (2006.01)
*G06F 3/00* (2006.01)
*G06F 3/06* (2006.01)

(52) U.S. Cl.
CPC ....... *G01R 31/2851* (2013.01); *G06F 3/0604* (2013.01); *G06F 3/0659* (2013.01); *G06F 3/0679* (2013.01)

(58) Field of Classification Search
CPC .......... G01R 31/2851; G01R 31/31716; G01R 31/31715; G01R 31/31712; H04L 1/243; G06F 3/0604; G06F 3/0659; G06F 3/0679
See application file for complete search history.

(56) References Cited

U.S. PATENT DOCUMENTS

| | | | | |
|---|---|---|---|---|
| 2005/0229132 A1* | 10/2005 | Butt | ..................... | G06F 17/5045 326/30 |
| 2007/0291830 A1* | 12/2007 | Hori | ....................... | G11C 29/56 375/220 |
| 2010/0077267 A1* | 3/2010 | Perego | ................ | G06F 13/1678 714/716 |
| 2019/0066816 A1* | 2/2019 | Dono | ................... | G11C 29/022 |

* cited by examiner

*Primary Examiner* — Christine T. Tu

(57) ABSTRACT

A byte lane of an integrated circuit including two data strobe loopback paths that allow external test signals to flow in and out of the integrated circuit through data strobe pins in two opposite directions. The integrated circuit includes a Feed Forward Equalization (FFE) path configured to send FFE signals output from the FFE logic via a transmitter set to a first data strobe interface during a normal operation. In a loopback test mode operation, a test signal can be supplied from a second data strobe interface and output to the first data strobe interface by reusing the FFE path. The second loopback path conversely allows a test signal to be routed from the first data strobe interface to the second.

21 Claims, 10 Drawing Sheets

EXTERNAL DQS BI-DIRECTIONAL LOOPBACK WITH USE OF FEED FORWARD EQUALIZATION PATH

TECHNICAL FIELD

Embodiments of the present invention are related to the field of integrated circuits, and in particular, to loopback test mechanisms in integrated circuits.

BACKGROUND OF THE INVENTION

External Loopback is commonly used for testing interface circuits in microchips by configuring the internal circuitry to allow an input test signal to be input into the receiver of an interface and routed back out through the transmitter of the interface. The output signal is analyzed and compared to the input signal to see how the internal circuitry affects the input signal. When the test signal is inside of the interface, it follows a pre-determined path that is designed to test specific internal circuits. External loopback is useful for characterizing the circuits along the internal path and providing the visibility outside the silicon that would otherwise be impossible to check. Particularly, such characterization can be used to facilitate lab to production transition.

In a typical synchronous dynamic random-access memory (SDRAM) design, each data byte (8 bits of data) of a ×8 SDRAM device or each nibble (4 bits of data) of a ×4 SDRAM device is associated with a dedicated data strobe (DQS). The data bits (DQ) and differential data strobe (DQS) are transported through bi-directional buses and are driven by the memory controller during a memory write and driven by the memory during a memory read. Conventionally, in the application of having two ×4 devices for a data byte, a memory controller only integrates a single-direction loopback path that allows tests signals to be input from a particular data strobe interface (e.g., DQS1) and return to the other data strobe interface (e.g., DQS0). In a device capable of differential data strobe, each data strobe interface may include a pair of data strobe ports, each port coupled to a pin and a pad. For example, a differential test signal can be input from a pair of data strobe pins (e.g., DQS1_P/DBI and DQS1_N pins) and returns to another pair of data strobe pins (e.g., DQS0_P and DQS0_N pins). Therefore, only the internal circuitry along this particular path can be characterized.

SUMMARY OF THE INVENTION

Disclosed herein is a memory controller having loopback paths that allow for bi-directional external loopback tests through data strobe pins without introducing circuit complexity.

Embodiments of the present disclosure include a Feed Forward Equalization (FFE) path in the interface of a memory controller configured to serve the dual-use of FFE data signal transmission in a normal operation (e.g., a write operation) and test signal transmission in an external loopback test. More specifically, the memory controller includes FFE logic operable to invert and delay data signals in a normal operation and thereby generate an FFE signal acting to deemphasize low frequency components in the data signal. The data signal (or an inverted version thereof through Data Bus Inversion (DBI)) is supplied to a first transmitter set and the FFE signal is supplied to a second transmitter set. The data signal and the FFE signal are combined at the outputs of the transmitters which are connected together and then supplied to a data strobe interface (the first data strobe interface), e.g., the interface coupled to data strobe pins DQS1_P/DBI and DQS1_N. The resultant signal is an equalized signal which is transmitted to a memory device. The effective strength of the FFE signal to the equalized signal is controlled by the number of driver slices in the two transmitter sets relative to each other. In an external loopback operation, the FFE path coupled between the output of the FFE logic and the first data strobe interface is reused as part of a loopback route (the first loopback route). More specifically, an external test signal can be supplied to a second data strobe interface (e.g., through the pair of data strobe pins DQS0_P and DQS_N), propagate through a first receiver and the FFE path disposed between the FFE logic and the first data strobe interface, the FFE path including the second transmitter set. Eventually, the test signal is output from the first data strobe interface (e.g., through the DQS1_P/DBI and DQS1_N pins) for analysis. In addition, the memory controller also includes a second loopback route that allows a testing signal (e.g., a differential test signal) to be supplied from the first data strobe interface (e.g., via DQS1_P/DBI and DQS1_N pins), propagates through a second receiver and a third transmitter set, and output from the memory controller through the second data strobe interface (e.g., to DQS0_P and DQS0_N pins).

Therefore, in the embodiments of the present disclosure, test signals can loop into a memory controller through the DQS0 interface and out from the DQS1 interface, and conversely loop into the DQS1 interface and out from the DQS0 interface. Compared with the conventional single-direction loopback, bi-directional loopback advantageously allows characterization of additional internal circuitry in the microchip, particularly, the second receiver coupled to the second data strobe for example. Further, the loopback configurations advantageously reuse existing operation mode circuitry coupled to the FFE logic, without degrading the performance of operation mode features, such as, by four clock (×4), data bus inversion (DBI), feed forward equalization (FFE), and write deskew.

This summary contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying figures, in which like reference characters designate like elements.

DETAILED DESCRIPTION

Figure 1A:
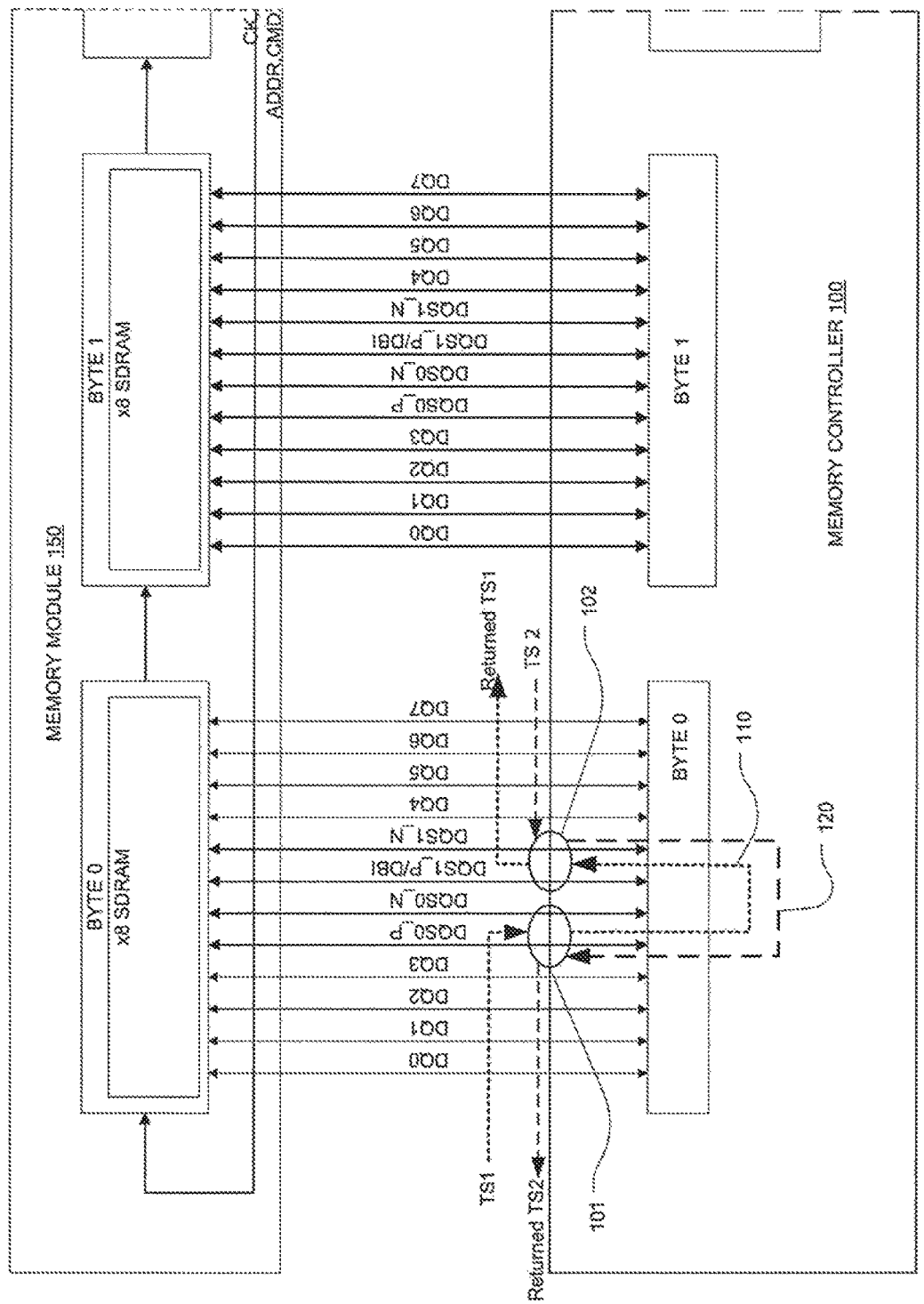
FIGS. 1A and 1B illustrate signal transmission between exemplary memory controllers and memory components in normal data operations and signal transmission within the memory controller in external loopback operations in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

External DQS Bi-Directional Loopback with Use of Feed Forward Equalization Path

Overall, embodiments of the present disclosure provide an integrated circuit built-in with two data strobe loopback paths associated with one byte lane. The two data strobe loopback paths allow external test signals to flow in and out of the integrated circuit through data strobe pins in two opposite directions. The integrated circuit includes a Feed Forward Equalization (FFE) path configured to send FFE signals output from FFE logic via a transmitter set to a first data strobe interface during a normal operation, e.g., a memory write operation. In a loopback test mode operation, the first loopback path reuses the FFE path, such that a test signal can be supplied from a second data strobe interface and output to the first data strobe interface via the FFE path. The second loopback path conversely allows a test signal to be routed from the first data strobe interface to the second data strobe interface. Since the FFE path can serve as dual-use circuitry for both a loopback operation and a normal operation, the first loopback path is advantageously provided without introducing complicated addition to the circuitry for normal operations.

FIG. 1A illustrates signal paths between an exemplary memory controller 100 and a memory component 150 in normal data operations and signal paths within the memory controller 100 in external loopback operations in accordance with an embodiment of the present disclosure. The memory controller 100 is configured to manage data flow to and from the memory component 150. In this example, the memory component 150 is a double data rate (DDR) synchronous dynamic random-access memory (SDRAM) that can operate in a ×8 clock mode as described in greater detail below. Each data byte (8 bits of data) is associated with two dedicated data strobe interfaces (DQS0 and DQS1), as described in greater detail below. Each data strobe interface may be coupled to two pins/pads and configured for receiving the two components of a different signal. Particularly, the DQS0 interface includes ports coupled to DQS0_P and DQS0_N pins, and the DQS1 interface includes ports coupled to DQS1_P/DBI and DQS1_N pins. The data bits (DQi, i=0, . . . , 7) and strobe signals travel through bi-directional buses that are driven by the memory controller 100 during a memory write and driven by the memory component 150 during a memory read. FIG. 1A shows two bytes of data (i.e., DQ) and DQS signals associated with each byte.

Generally, layout techniques exist to limit the amount of phase mismatch that is generated between two routes between the same two points. The phase relationship between two signals can also be thought of as the arrival time difference between the two signals. All signals in the same metal layer that follow rules about spacing distance to neighboring signals should travel at about the same speed. If the speed of the signal is fixed, then the length of the route will determine when the signal arrives, and if it is desired that two signals should arrive at the same time, then their lengths should be the same. The memory controller 100 may include a plurality of groups of DQ and DQS signals that are length matched.

Figure 2:
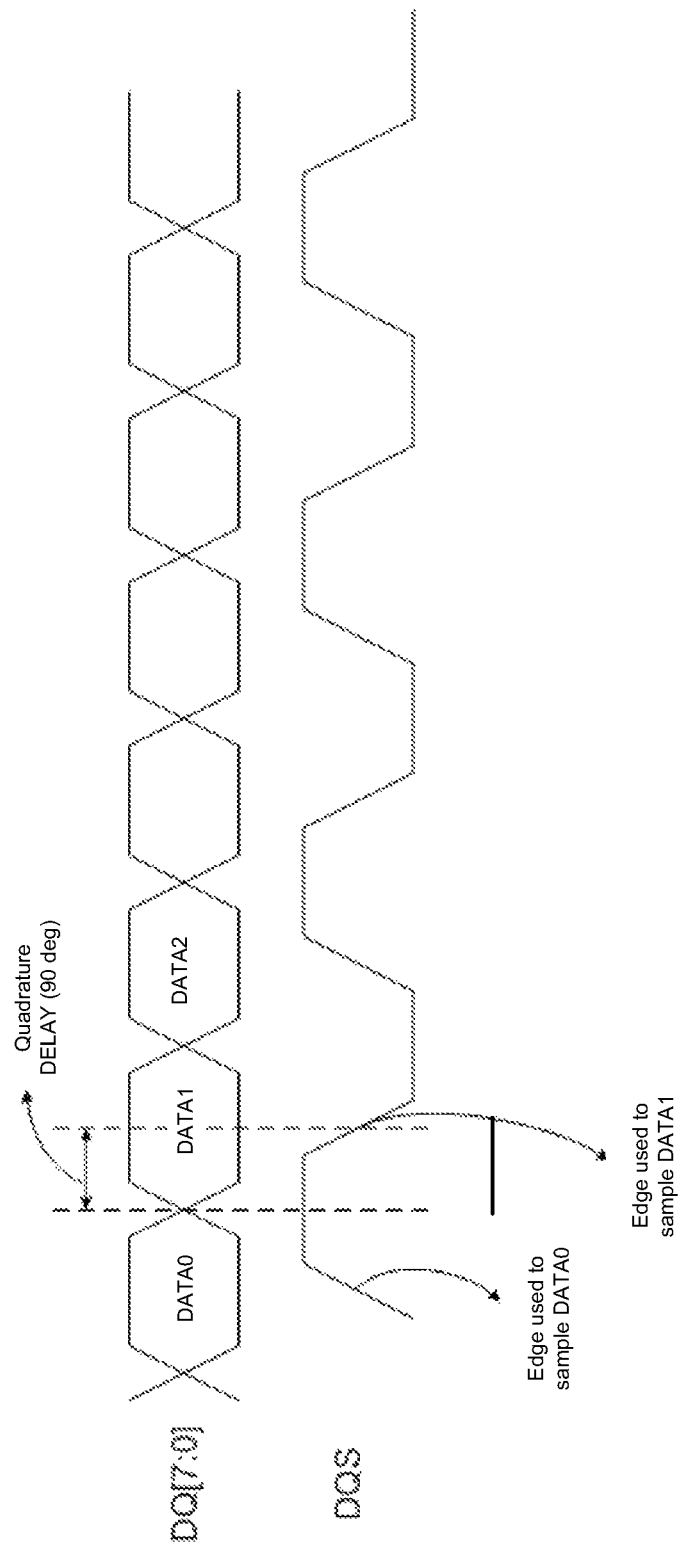
FIG. 2 shows the sample waveforms of DQ and DQS after quadrature phase shift.

During a memory write operation, memory controller 100 outputs DQS and DQ signals (or bits) to be phase aligned with 90 degree phase shift with respect to each other (also known as a quadrature cycle offset). During a memory read operation, the memory 150 sends DQS and DQ signals with edges aligned to the controller 100. The controller 100 then needs to delay the incoming DQS signal such that it is spaced by a ¼ clock period from the incoming DQ signals or bits. The DQS signal is used to sample the DQ bits by the memory 150 during a write operation and by the memory controller 100 during a read operation. FIG. 2 shows the sample waveforms of DQ and DQS after quadrature phase shift.

According to the present disclosure, the memory controller 100 includes two internal loopback paths 110 and 120 for one byte lane (e.g., BYTE 0 as shown), the loopback paths coupled between the data strobe interfaces DQS0 101 and DQS1 102. For example, in a loopback test mode, e.g., before the memory 150 is coupled to the controller 100, a test signal TS1 can be supplied to the memory controller 100 from DQS0 101, propagate through the first loopback path 110 (shown as a dotted route) and exit the memory controller from the DQS1 102; and a test signal TS2 can be supplied from DQS1 102, propagate through the second loopback path 120 (shown as the dashed route) and exit from the DQS0 101.

Figure 1B:
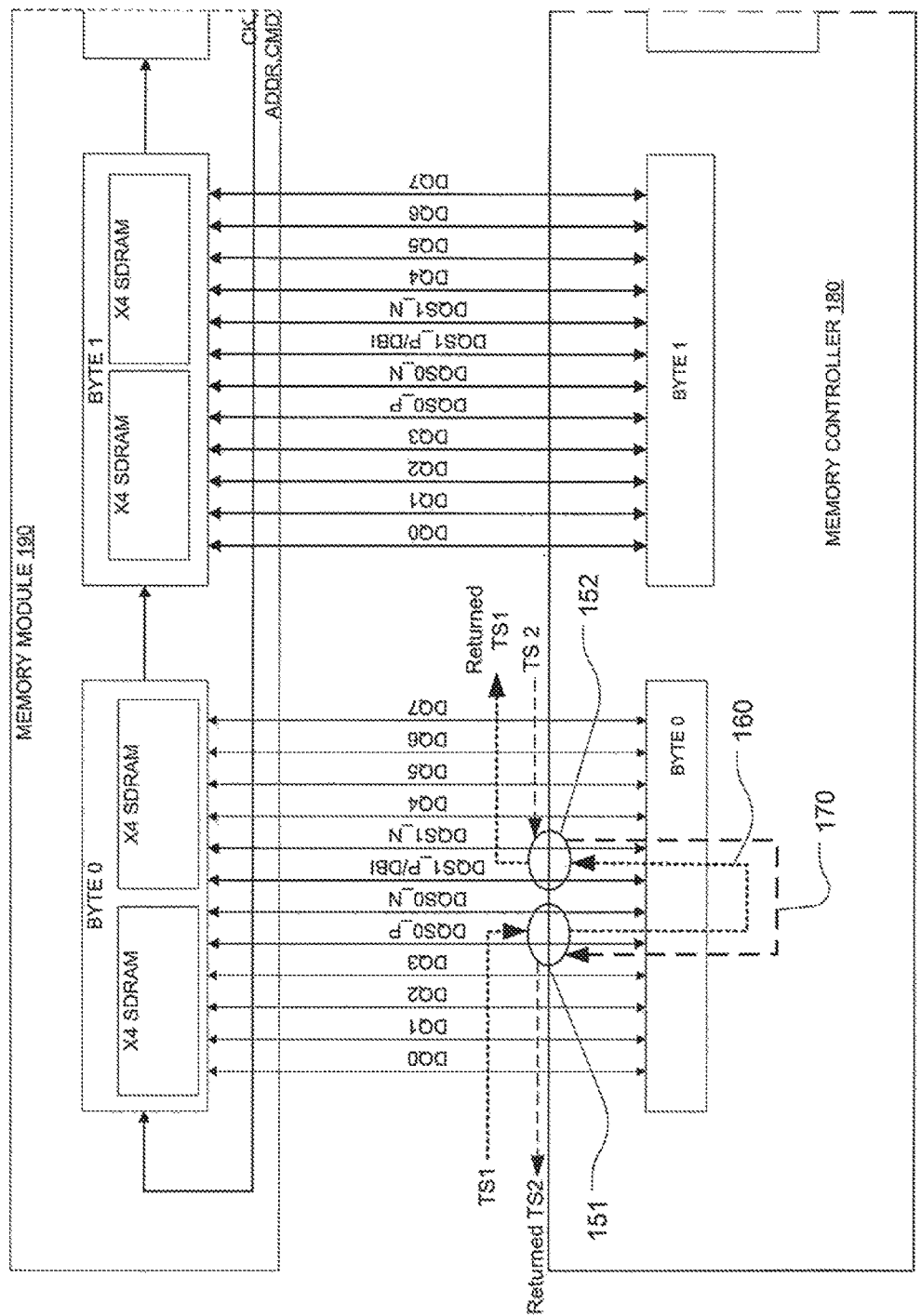

FIG. 1B illustrates signal paths between an exemplary memory controller 180 and a memory component 190 in normal data operations and signal paths within the memory controller 180 in external loopback operations in accordance with an embodiment of the present disclosure. In this example, the memory component 190 is a DDR SDRAM configured to operate in a ×4 clock mode as described in greater detail below. Each nibble of data (4 bits of data) is associated with a dedicated data strobe interfaces (DQS0 or DQS1). Similar with the example shown in FIG. 1A, the memory controller 180 includes two internal loopback paths 160 and 170 in one byte lane (e.g., BYTE 0 as shown), the loopback paths coupled between the strobe interfaces DQS0 151 and DQS1 152. For example, in a loopback test mode, a test signal TS1 can be supplied to the memory controller 180 from DQS0 151, propagate through the first loopback path 160 (shown as a dotted route) and exit the memory controller from the DQS1 152; and a test signal TS2 can be supplied from DQS1 102, propagate through the second loopback path 170 (shown as the dashed route) and exit from DQS0 101.

Figure 3:
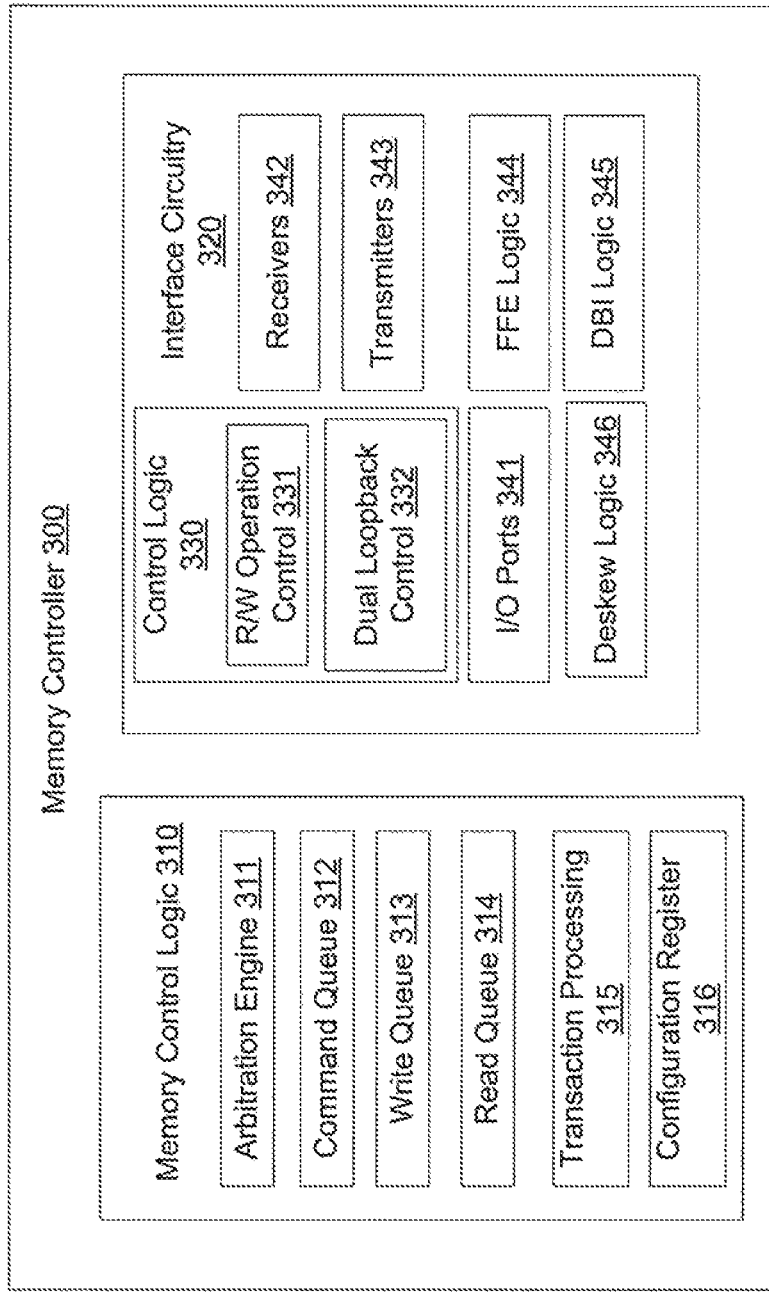
FIG. 3 is a block diagram illustrating the configuration of an exemplary memory controller with the capability of bi-direction external loopback in accordance with an embodiment of the present disclosure.

FIG. 3 is a block diagram illustrating the configuration of an exemplary memory controller 300 capable of bi-direction external loopback in accordance with an embodiment of the present disclosure. The memory controller 300 can be a standalone chip or integrated with other circuitry device, such as being placed on the same die or as an integral part of a microprocessor. The memory controller 300 includes memory control logic 310 composed of an arbitration engine 311, a command queue 312, write queue 313, a read queue 314, a transaction processing unit 315 and a configuration register 316, as well as a wide range of other functional components that are well known in the art.

The memory controller 300 further includes interface circuitry 320 that can be coupled to an external memory device or an on-chip memory through a bus and can receive and transmit signals related to read and write operations. The interface 320 also includes embedded bi-direction loopback paths and can receive and transmit test signals in loopback test operations. The interface circuitry 320 includes input and output interfaces 341 coupled to pins, receivers 342, transmitters 343, FFE logic 344, Data Bus Inversion (DBI) logic 345, deskew logic 346 etc. These components may be implemented in any suitable configurations that are well known in the art.

The memory controller 300 has the versatility to be configured in different modes for normal operations and loopback operations. Accordingly and subject to the control by the interface control logic 330, the interface circuitry 320 can operate in various modes, such as a ×4 clock mode, a ×8 clock mode, a DBI mode, FFE mode, a deskewed mode, or a combination thereof. Herein, a normal operation refers to a writing operation from the memory controller to the memory or a reading operation from the memory to the memory controller.

By four clock (×4) refers to an operation in which two DQS signals are generated (DQS0, DQS1) and each DQS signal is associated with 4 DQ bits, as opposed to an by eight clock (×8) operation where only one DQS signal (DQS0) is associated with all 8 DQ bits in the byte. By four clock mode can be used at the memory controller side when interfacing with two ×4 SDRAM devices off chip for example. In the by four clock (×4) mode, an extra bi-directional clock signal, DQS1 signal is sent between the memory controller and the memory, as shown in FIGS. 1A and 1B.

Data Bus Inversion (DBI) is a mechanism used to improve the signal integrity of a byte between the memory controller and the memory. When DBI is enabled and if a byte of data on the line (all 8 DQs) contains 5 or more zeros, the entire byte is inverted and a $9^{th}$ bit, DBI bit, is asserted low. This helps reduce the amount of transitions on the bi-directional bus between the memory controller and the memory. The DBI feature requires an additional bi-directional signal (e.g., "dbi" 501 signal in FIG. 5) to be communicated between the memory controller and the memory. This signal can be multiplexed with the DQS1 signal because by four clock mode and DBI usually are not used at the same time, as shown in FIGS. 5-8.

FFE is a mechanism of improving signal integrity on the bus by shaping and de-emphasizing the low-frequency components of the data signals (all DQ bits and DBI bit) relative to the high-frequency components. Typically, an individual bit between the memory controller and the memory has more attenuation at high frequency than low frequency, so when the bit passes through the channel, the high frequency part of the signal, like the edges, may be degraded. FFE corrects this problem by using an FFE signal or equalizing signal to de-emphasize the low frequency parts of the data signal so that when the data passes through the channel, the high frequency and low frequency parts have about the same magnitude.

Deskew is a mechanism of improving timing margin by adjusting the phase alignment of the data (DQ) bits relative to its DQS to correct for any phase delay mismatch between the memory controller and the memory. A phase delay mismatch can be caused by layout mismatch on Print Circuit Board (PCB) and package as noted above. The deskewed version of a signal can be considered as the signal with a small positive or negative phase delay.

Figure 4:
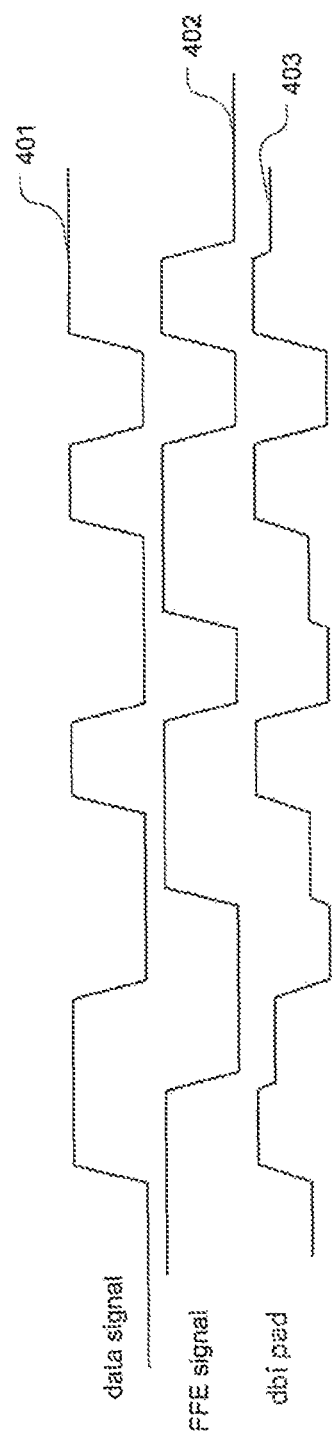
FIG. 4 illustrates relationship between a data signal, an FFE signal, and resultant signal showing deemphasized low frequency sections.

FIG. 4 illustrates relationship between a data signal 401, an FFE signal 402 (or "equalizing signal" herein), and an equalized signal 403 showing deemphasized low frequency sections. The de-emphasis of the low frequency components of the data signal is accomplished by combining the data signal with the FFE signal. The resultant equalized signal as output at "dbi pad" has higher amplitude near the transitions, which are the high frequency parts of the transient signal, than it does in the steady parts, which is the low frequency part of the transient signal.

Figure 5:
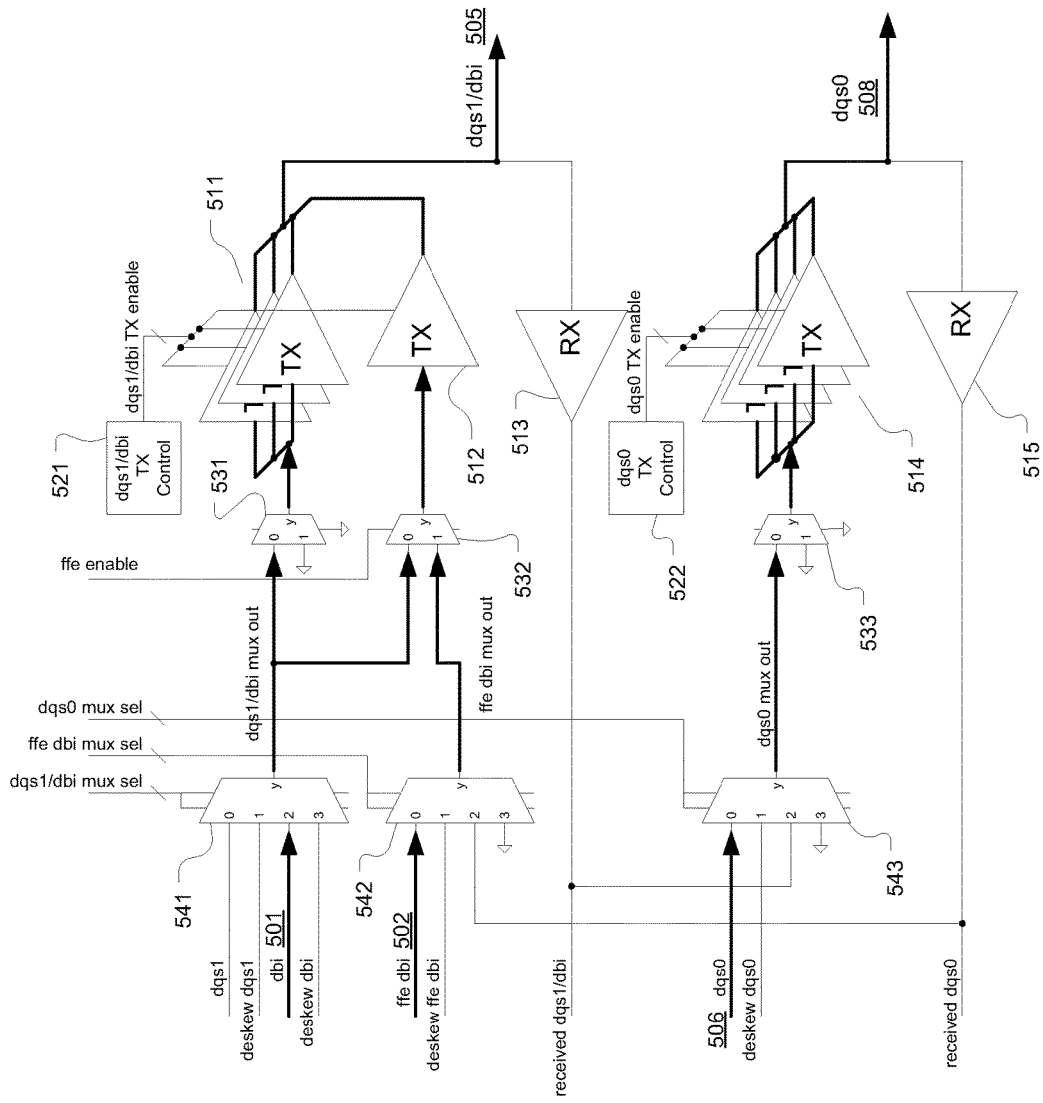
FIG. 5 illustrates the configuration of exemplary interface circuitry in a memory controller and active signal paths in a normal ×8 clock FFE DBI mode operation according to an embodiment of the present disclosure.

FIG. 5 illustrates the configuration of an exemplary interface circuitry 500 in a memory controller and the active signal paths in a normal a ×8 clock FFE DBI mode operation according to an embodiment of the present disclosure. The memory controller 500 includes various logic units (not explicitly shown) as shown in FIG. 3 for example.

The interface circuitry 500 includes a first receiver 513 and a first set of transmitters (TX) 511 composed of 3 parallel TX driver slices at the DQS1 interface coupled to the "dqs1/dbi" 505. The DQS1 interface is also coupled to a second set of transmitter 512 of a single driver slice. The TX drivers 511 and 512 can be selectively enabled by the dqs1 TX control logic 521. The multiplexer 541 is coupled to the logic units in the memory controller as shown in FIG. 3, particularly the FFE logic, the DBI logic and the deskew logic, which are operable to generate the data strobe signal "dqs1," the deskewed data strobe signal "deskew dqs1", the DBI signal "dbi," and the deskewed DBI signal "deskew dbi." Similarly, the multiplexer 542 is coupled to the logic units configured to generate FFE signal "ffe dbi" and the deskewed FFE signal "deskew ffe dbi." Select signals of the multiplexers can be generated by the interface control logic 330 in FIG. 3.

When the FFE mode is enabled as controlled by the select signal "ffe enable," the multiplexer 532 selects to output the signal supplied from the multiplexer 542; and when FFE is disabled, the multiplexer 532 selects to output the signal supplied from the multiplexer 541.

The multiplexer 543 is coupled to the logic units configured to generate the signals "dqs0" and "deskew dqs0" and also coupled to the output of the receiver 513. The DQS0 interface (e.g., "dqs0" 508") is coupled to a third set of transmitters 514 composed of 4 TX driver slices and a receiver 515. The output of the receiver 515 is coupled to another input of the multiplexer 542. The transmitter driver 514 can be selectively enabled by the dqs0 TX control logic 522.

During normal operation of the ×8 clock FFE DBI mode, the memory control logic operates to generate the data signal "dbi" 501, the delayed and inverted data signal (the FFE signal) "ffe dbi" 502, and the data strobe signal "dqs0" 506, which are supplied to the interface circuitry 500. Two active signal paths participate in this normal operation, which are highlighted by the arrowed lines, referred as DQS0 and DQS1 paths. The DQS0 path includes the multiplexers 543 and 533 and the TX driver slices 514 which act in unison as their input and output are tied together. The dqs0 TX control block 522 adjusts the drive strength of the ×8 clock from 1 to 4 parallel TX slices. The DSQ1 path includes a DBI path and an FFE path, which have multiplexers 541, 542, 531 and 532 and the transmitters 511 and 512. However, it will be appreciated that the FFE path may include other suitable components that are well known in the art. More specifically, in the DQS0 path, the data strobe signal "dqs0" is selected, as controlled by the select signal "dqs0 mux sel," output from the multiplexer 543 and supplied to the DQS interface "dqs0" 508 through the multiplexer 533 and the transmitters 514. As for the DQS1 path, the multiplexer 541 outputs the "dbi" signal to the multiplexers 531 and 532 and then to the first set of transmitters 511. The multiplexer 532 selects to output the "ffe dbi" signal to the transmitter 512 since FFE is enabled. The "dbi" and "ffe dbi" signals are combined at the outputs of the transmitters 511 and 512, where parallel slices of the TX drive the output at the DQS1 interface "dqs1/dbi" 505. The dqs1/dbi TX control logic 521 enables the one TX driver slice 512 for the FFE path, and adjusts the TX drive strength of the normal path from 1 to 3 parallel slices.

Figure 6:
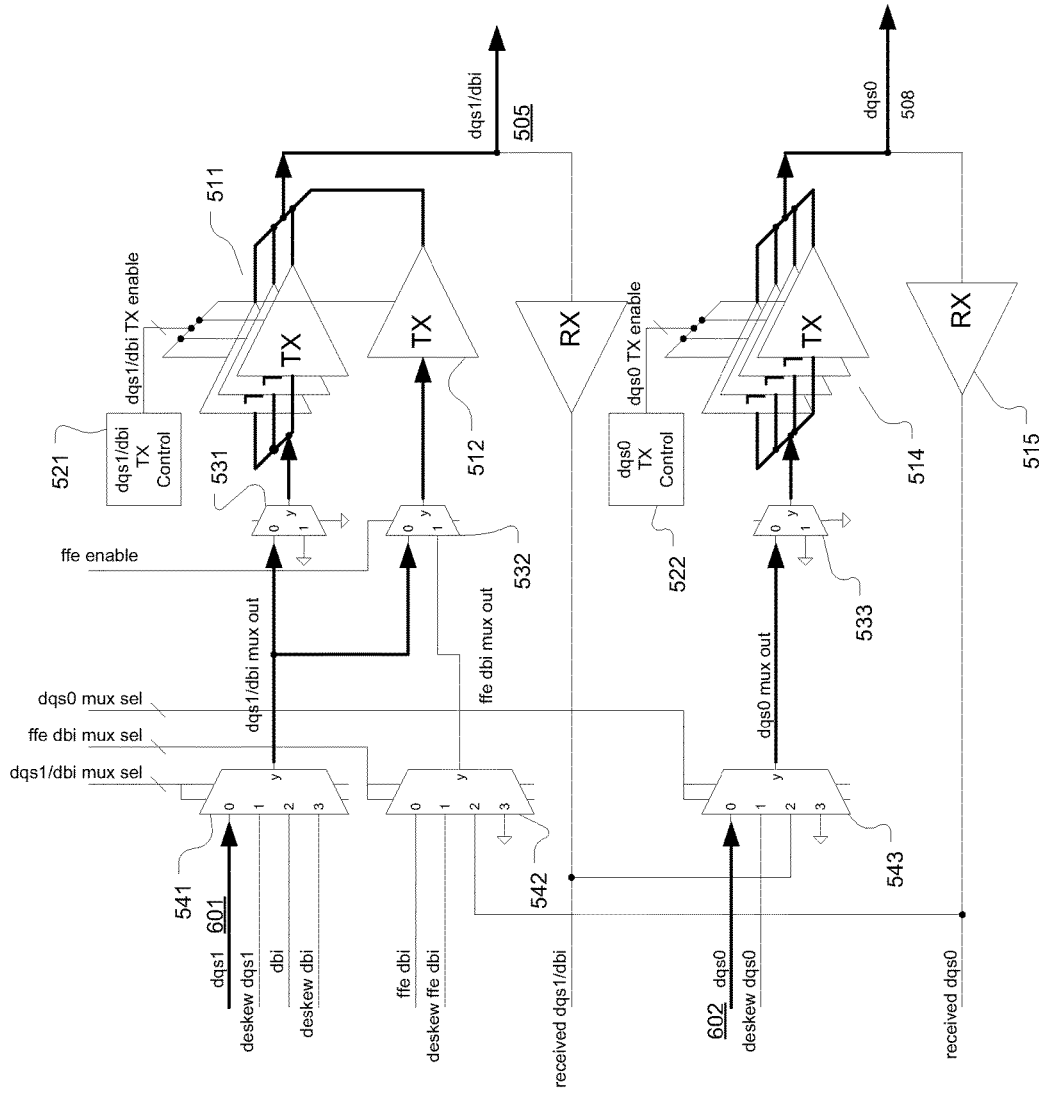
FIG. 6 illustrates the active signal paths in a normal ×4 clock mode operation with FFE disabled in the exemplary interface also shown in FIG. 5.

FIG. 6 illustrates the active signal paths in a normal ×4 clock mode operation with FFE disabled in the exemplary interface also shown in FIG. 5. The active paths are highlighted by the arrowed lines. In this operation mode, the DQS0 path is active and carries clock-like pattern signals. As controlled by the select signal "dqs0 mux sel," the multiplexer 543 outputs the "dqs0" signal 602 to the TX driver slices 514 via the multiplexer 533. As a result, the "dqs0" signal 602 is sent out at the DQS0 interface "dqs0" 508. In the DQS1 path, the multiplexer 541 selects to output the "dqs1" signal as controlled by the select signal "dqs1/dbi mux sel". In each transmitter set 511 or 512, all the driver slices receive the same input signal since "ffe enable" is "0." More specifically, the dqs0 TX control logic 522 adjusts the drive strength of signal "dqs0" from 1 to 4 parallel TX driver slices; and the dqs1/dbi TX control logic 521 adjusts the drive strength of the MUX 541 output ("dq1/dbi mux output") from 1 to 4 parallel TX driver slices.

Figure 7:
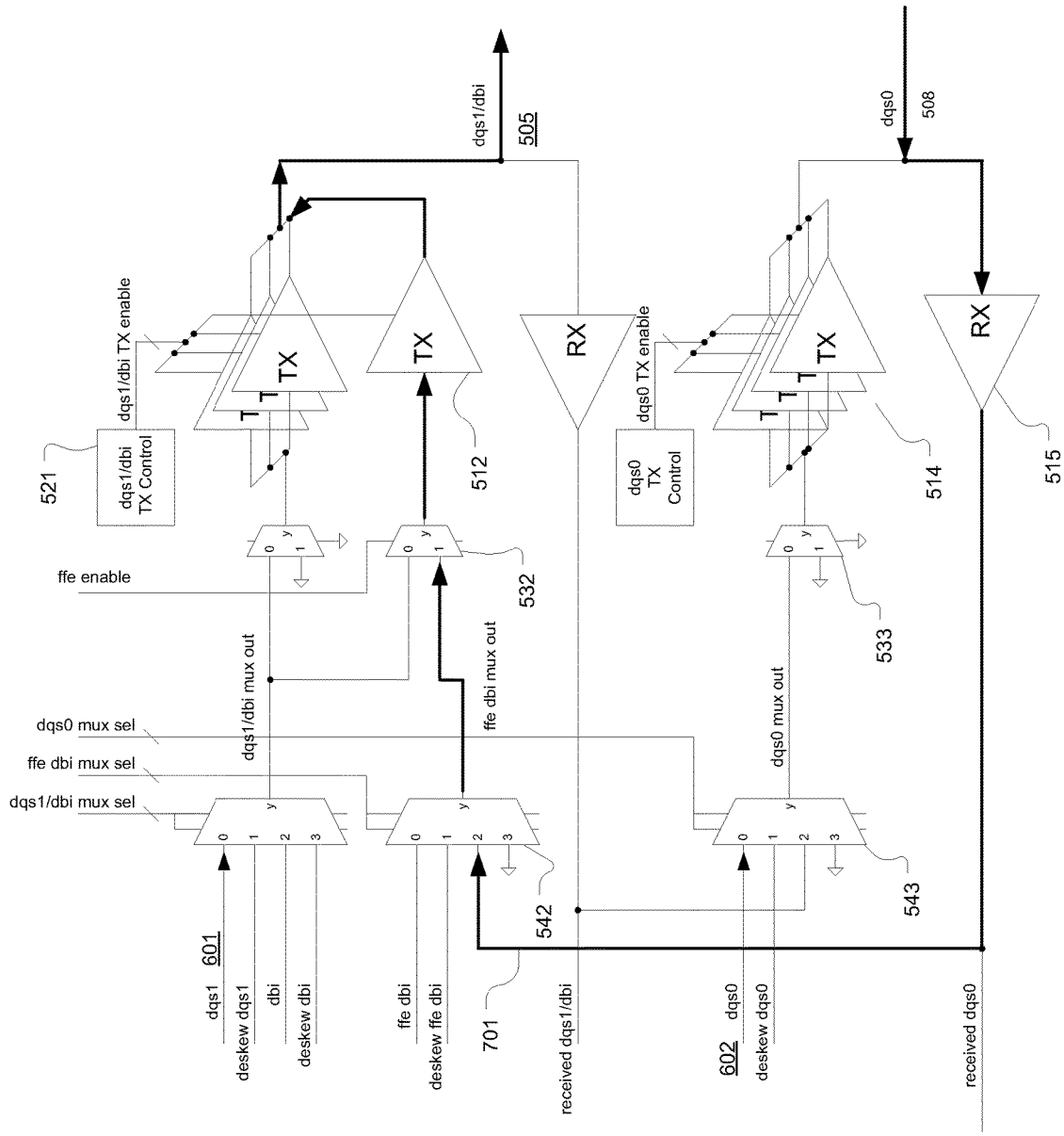
FIG. 7 illustrates the active signal path in a first loopback test mode by looping a test signal from the DQS0 interface to the DQS1 interface in the exemplary interface also shown in FIGS. 5-6.

According to embodiments of the present disclosure, the FFE path used to transport an FFE signal in a normal operation, e.g., signal "ffe dbi" or "deskew ffe dbi," is reused to transport a loopback signal in an external loopback test mode for output at the DQS1 interface, e.g., "dqs1/dbi" 505. In the illustrated example, the FFE path includes the multiplexers 542 and 532 and the transmitter slice 512. FIG. 7 illustrates the active signal path in a first loopback test mode by looping a test signal from the DQS0 interface 508 to the DQS1 interface 505 in the exemplary interface also shown in FIGS. 5-6.

The signal path in the loopback test operation is highlighted by arrowed lines. During a loopback test operation, a test signal is input to the memory controller from the DQS0 interface 508 and received by the receiver 515. The test signal may be a differential signal that is input through a pair of pins coupled to the DQS0 interface 508, e.g., DQS0_P and DQS0_N shown in FIGS. 1A and 1B. The receiver 515 is coupled to an input of the multiplexer 542, e.g., a 4:1 MUX. The control logic (e.g., 330 in FIG. 3) of the interface circuitry 500 generates the select signal "ffe dbi mux sel," so that the multiplexer 542 outputs the test signal 701. The control logic also generates the select signal "ffe enable," so that the multiplexer 532 outputs the test signal and send it to the transmitter slice 512. The dqs1/dbi TX control 521 enables the one TX slice 512 of the FFE path and disables the remaining 3 slices of the normal path that are parallel to the FFE slice (DBI path shown in FIGS. 5-6), so that these 3 slices do not combine their output signals with the FFE slice output signal. In this operation mode, the normal path signals may be unknown data which should not be combined with the FFE path signal. Eventually, the test signal is output from the memory controller via the DQS1 interface "dqs1/dbi" 505.

In this configuration, the FFE path is used to enable an external loopback. The complexity of the FFE path is advantageously overcome with a modification to the TX slice control. Also, using the FFE path for loopback is advantageous over using the normal DQS1/DBI path because the latter would necessitate the conversion of the 4:1 multiplexer 541 on the normal path for DQS1/DBI to become an 8:1 multiplexer, which is the next size up. An 8:1 multiplexer would undesirably double the output capacitance related to the multiplexer and take up twice as much area. Additionally, since the DQS0 multiplexer 543 should match the DQS1/DBI multiplexer 541 to preserve phase delay matching in the memory controller, the DQS0 multiplexer 543 would also undesirably have the double output capacitance and area penalty.

Figure 8:
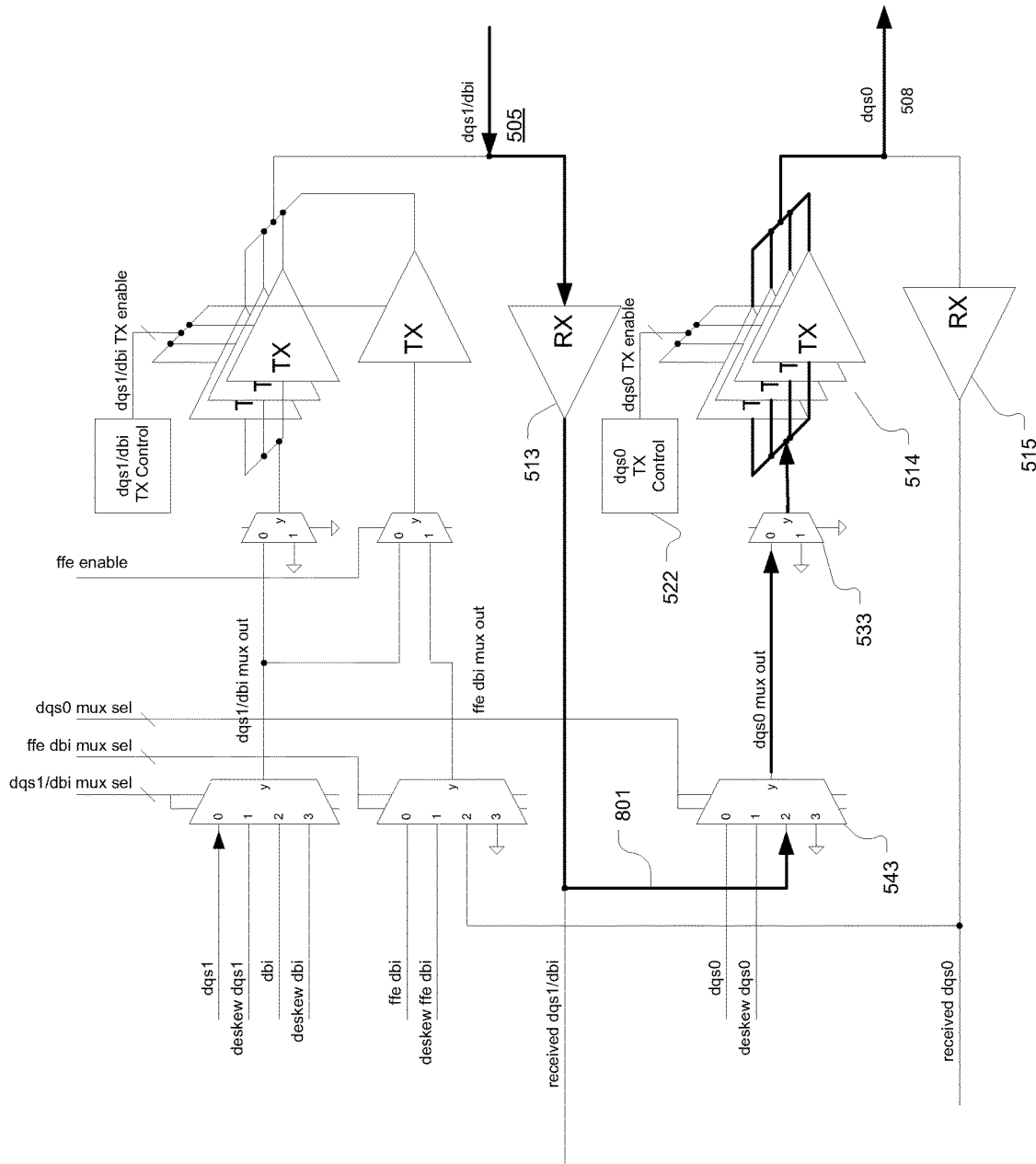
FIG. 8 illustrates the active signal path in a second loopback test mode by looping a test signal from the DQS1 interface to the DQS0 interface in the exemplary interface shown in FIGS. 5-7.

FIG. 8 illustrates the active signal path in a second loopback test mode by looping a test signal from the DQS1 pin 505 to the DQS0 pin 508 in the exemplary interface shown in FIGS. 5-7. The signal path is highlighted by the arrowed lines. During loopback operation, a test signal is input to the memory controller from the DQS1 interface 505 and received by the receiver 513. The test signal may be a differential signal that is input through a pair of pins coupled to the DQS1 interface 505, e.g., DQS1_P/DBI and DQS1_N shown in FIGS. 1A and 1B. The receiver 513 output is coupled to an input of the multiplexer 543, e.g., a 4:1 MUX. The control logic (e.g., 330 in FIG. 3) of the interface 500 generates the select signal "dqs0 mux sel," and so the multiplexer 543 outputs the test signal 801. The dqs0 TX control logic 522 adjusts the drive strength from 1 to 4 parallel TX slices. Eventually, the test signal is output from the memory controller via the DQS0 interface 508.

As shown in FIGS. 7 and 8, the interface circuitry 500 includes two loopback test paths disposed between two strobe pins, which allow test signals to flow into the integrated circuit through one DQS interface (e.g., coupled to a pair of pads/pins) and out from the other, and vice versa. In some embodiments, the receivers coupled to the two strobe interfaces have different configurations. For example, the DQS0 receiver 515 may be configured as a differential receiver, while the DSQ1 receiver 513 can operate as either a differential receiver or a single-ended receiver. Bi-directional loopback advantageously enables characterization of both types of receiving paths.

Figure 9:
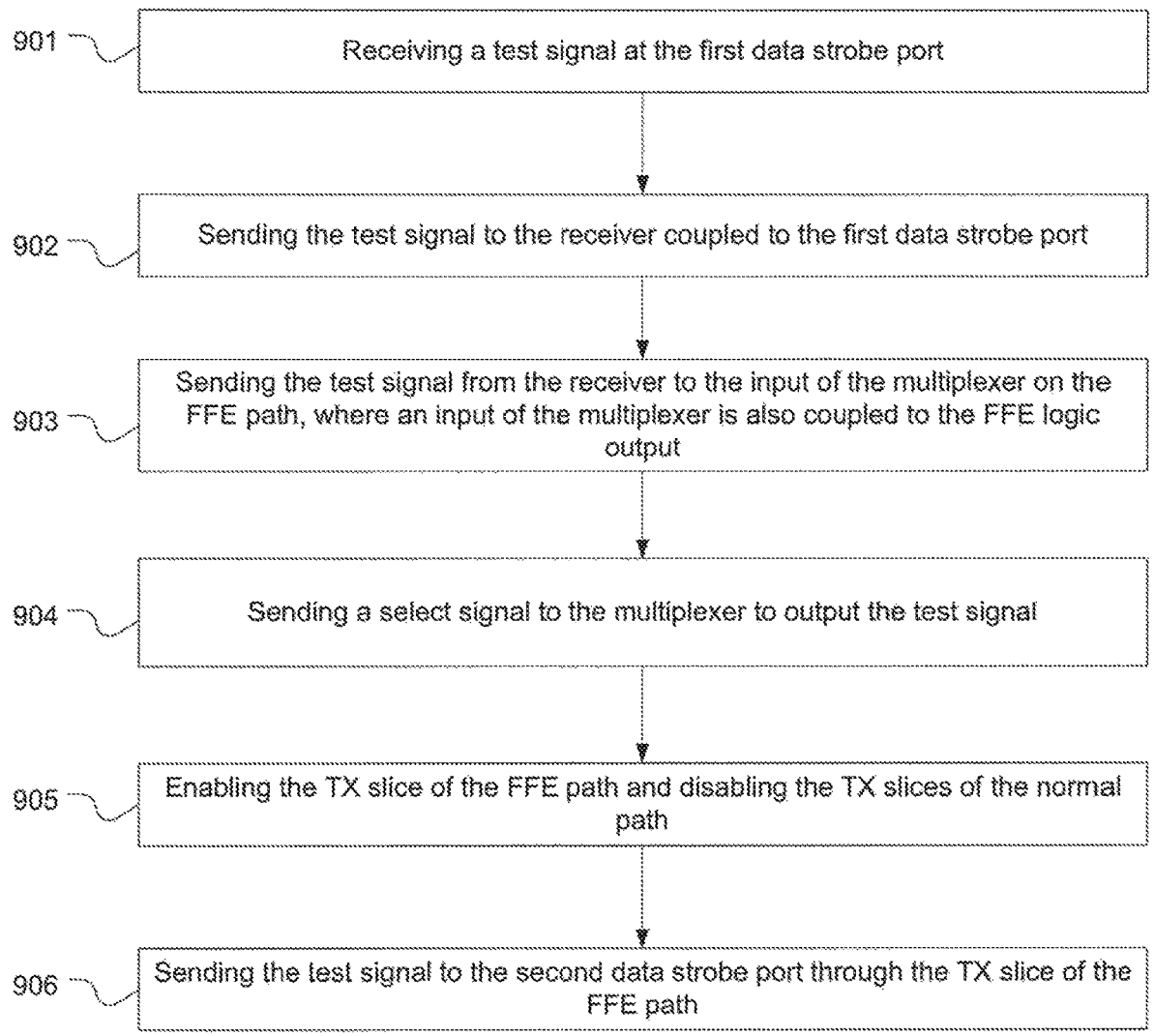
FIG. 9 is a flow chart depicting an exemplary process of performing an external loopback test by reusing an FFE path in accordance with an embodiment of the present disclosure.

FIG. 9 is a flow chart depicting an exemplary process 900 of performing an external loopback test by reusing an FFE path in accordance with an embodiment of the present disclosure. Process 900 may be performed by a memory controller interface as configured in FIGS. 5-8 or any other suitable integrated circuit having an FFE path. At 901, a test signal is input to the memory controller via the first data strobe interface. At 902, the test signal is sent to the receiver coupled to the first data strobe interface. At 903, the test signal is sent from the receiver to the input of the multiplexer on the FFE path. The multiplexer is also coupled to the output of the FFE logic of the memory controller and configured to output FFE signals in normal operations. However, in this loopback operation, the select signal is generated to control the multiplexer to output the test signal instead, at 904. At 905, the TX driver slice of the FFE path is enabled and the TX driver slices of the normal path are disabled, where the FFE path slice is coupled to the output of the multiplexer. At 906, the test signal is sent to the second data strobe interface and thereby output from the memory controller through the FFE path TX slice. The output test signal is then analyzed against the input test signal using oscilloscope or any other suitable diagnostic tool.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law. Any claimed embodiment of the invention does not necessarily include all of the objects or embodiments of the disclosure.

What is claimed is:

1. An integrated circuit comprising:
a first data strobe interface and a second data strobe interface configured to be coupled to an external bus to receive and transmit data strobe signals;
feed forward equalization (FFE) logic configured to generate FFE signals based on data signals;
a transmitter circuit coupled to said FFE logic through a first signal path for transmitting equalized signals to said second data strobe interface, wherein an equalized signal of said equalized signals is a combination of a data signal of said data signals and an FFE signal of said FFE signals; and
a first external path configured to route loopback test signals from said first data strobe interface to said second data strobe interface through said first signal path.

2. The integrated circuit of claim 1, wherein said equalized signals include signals from a first transmitter set combined with signals from said transmitter circuit, said transmitter circuit including a second transmitter set.

3. The integrated circuit of claim 2 further comprising data bus inversion (DBI) logic coupled to an input of said first transmitter set and configured to selectively generate inverted signals based on said data signals, and send said inverted signals to an input of said first transmitter set, and wherein said FFE logic is configured to generate said FFE signals by delaying and inverting one of said inverted signals.

4. The integrated circuit of claim 2 further comprising a second external path configured to route said loopback test signals from said second data strobe interface to said first data strobe interface.

5. The integrated circuit of claim 4 further comprising: a first receiver and a third transmitter set both coupled to said first data strobe interface; and a second receiver coupled to said second data strobe interface, wherein said first external path comprises said first receiver and said second external path comprises said second receiver.

6. The integrated circuit of claim 5, wherein said first receiver is configured to operate in a differential mode, and wherein said second receiver is configured to selectively operate in one of said differential mode and a single-ended mode.

7. The integrated circuit of claim 4 further comprising control logic configured to enable said first transmitter set in a data transmission operation and disable said first transmitter set in a loopback test operation.

8. The integrated circuit of claim 5 further comprising a multiplexer configured to selectively output said FFE signal and an output signal of said first receiver, wherein said integrated circuit further comprises control logic, and wherein said control logic is configured to generate a select signal directed to said multiplexer.

9. The integrated circuit of claim 8 further comprising deskew logic configured to generate deskewed signals based on said data signals, and wherein said multiplexer is further configured to selectively output a deskewed signal of said deskew signals.

10. A memory controller comprising:
interface circuitry; and
memory control logic configured to manage data flow with a memory storage device via said interface circuitry, wherein said interface circuitry comprises:
data interfaces configured to be coupled to an external bus and receive and transmit data signals;
a first data strobe interface and a second data strobe interface configured to be coupled to said external bus and receive and transmit data strobe signals, wherein said first data strobe interface and said second data strobe interface are further configured to receive and transmit loopback test signals;
feed forward equalization (FFE) logic configured to generate FFE signals based on said data signals;
a first data path coupled between said FFE logic and said second data strobe interface;
a first external path comprising said first data path and configured to transport said loopback test signals from said first data strobe interface to said second data strobe interface; and
a second external path configured to transport said loopback test signals from said second data strobe interface to said first data strobe interface.

11. The memory controller of claim 10, wherein said interface circuitry further comprises a first transmitter set comprising one or more first transmitters, wherein said first data path comprises a second transmitter set comprising one or more second transmitters and coupled to an output of said FFE logic, and wherein outputs of said first transmitter set and said second transmitter set are combined and a combined output of said first transmitter set and said second transmitter set is sent to said second data strobe interface.

12. The memory controller of claim 11, wherein said interface circuitry further comprises data bus inversion (DBI) logic coupled to an input of said first transmitter set and an input of said second transmitter set and configured to selectively generate inverted signals based on said data signals, and wherein said FFE logic is configured to generate said FFE signals by delaying and inverting one of said inverted signals.

13. The memory controller of claim 11, wherein said interface circuitry further comprises: a first receiver and a third transmitter set both coupled to said first data strobe interface; and a second receiver coupled to said second data strobe interface, and wherein said first external path comprises said first receiver and said second external path comprises said second receiver.

14. The memory controller of claim 13, wherein said first receiver is configured to operate in a differential mode, and wherein said second receiver is configured to selectively operate in one of said differential mode and a single-ended mode.

15. The memory controller of claim 13, wherein said first data path further comprises a first multiplexer configured to selectively output one of an FFE signal of said FFE signals and an output signal of said first receiver, wherein said interface circuitry further comprises control logic, and wherein said control logic is configured to generate a select signal directed to said first multiplexer.

16. The memory controller of claim 15, wherein said interface circuitry further comprises a second multiplexer configured to selectively output an output signal of said second receiver, wherein said control logic is further configured to generate a select signal directed to said second multiplexer.

17. The memory controller of claim 11, wherein said interface circuitry further comprises control logic configured to enable said first transmitter set for a data write operation and deactivate said first transmitter set for a test operation.

18. A method of performing external tests on an integrated circuit, wherein said method comprises:

receiving a test signal at a first data strobe interface of said integrated circuit;

sending said test signal to a first receiver coupled to said first data strobe interface;

sending said test signal from said first receiver to an input of a first multiplexer, wherein said first multiplexer comprises: another input coupled to an output of Feed Forward Equalization (FFE) logic; and an output coupled to a first transmitter set;

sending a select signal to said first multiplexer, wherein said select signal is operable to control said first multiplexer to output said test signal;

sending said test signal from said multiplexer to said first transmitter set;

sending said test signal from an output of said first transmitter set to a second data strobe interface of said integrated circuit; and analyzing said test signal received from an output of said second data strobe interface against said test signal received at said first data strobe interface.

19. The method of claim 18 further comprising disabling a second transmitter set, wherein an output of said second transmitter set and an output of said first transmitter set are coupled together, and wherein said disabling of said second transmitter set facilitates said sending of said test signal from said output of said first transmitter set to said second data strobe interface.

20. The method of claim 18 further comprising:

receiving another test signal at said second data strobe interface of said integrated circuit;

sending said another test signal to a second receiver coupled to said second data strobe interface;

sending said another test signal to a third transmitter set coupled to said first data strobe interface; and sending said another test signal from an output of said third transmitter set to said first data strobe interface.

21. The method of claim 20 further comprising:

sending said another test signal from said second receiver to an input of a second multiplexer, wherein an output of said second multiplexer is coupled to said third transmitter set; and sending a select signal to said second multiplexer, wherein said select signal sent to said second multiplexer is operable to control said second multiplexer to output said another test signal.

* * * * *